United States Patent [19]

Walden

[11] Patent Number: 5,030,926
[45] Date of Patent: Jul. 9, 1991

[54] VOLTAGE CONTROLLED BALANCED CRYSTAL OSCILLATOR CIRCUIT

[75] Inventor: Robert W. Walden, Madison, N.J.

[73] Assignee: AT&T Bell Laboratories, Murray Hill, N.J.

[21] Appl. No.: 550,776

[22] Filed: Jul. 10, 1990

[51] Int. Cl.$^5$ .............................................. H03B 5/36
[52] U.S. Cl. ............................... 331/116 FE; 331/158; 331/177 V; 331/DIG. 3
[58] Field of Search ............. 331/36 C, 108 A, 108 C, 331/P116 R, 116 FE, 158, 177 V, DIG. 3

[56] References Cited

U.S. PATENT DOCUMENTS

| Re. 31,523 | 2/1984 | Baker | 455/76 |
| 3,995,233 | 11/1976 | Waku | 331/116 R |
| 4,122,404 | 10/1978 | Fuhrman | 331/177 V |
| 4,827,226 | 5/1989 | Connell | 331/177 V |

Primary Examiner—David Mis
Attorney, Agent, or Firm—D. I. Caplan

[57] ABSTRACT

A voltage controlled crystal oscillator circuit, such as a Pierce oscillator circuit, includes an amplifier and is balanced by the addition of another varactor connected directly to the amplifier, whereby the frequency pull range is increased. Further, greater linearity can be achieved by adding another pair of varactors to the circuit.

13 Claims, 3 Drawing Sheets

VOLTAGE CONTROLLED BALANCED CRYSTAL OSCILLATOR CIRCUIT

BACKGROUND OF THE INVENTION

In prior art, a useful form of an oscillator circuit is a crystal oscillator circuit. Such a circuit comprises and oscillator element (e.g., quartz cyrstal), a pair of electrodes attached to the oscillator element, and an inverting amplifying element connected across the electrodes. Such a circuit has a resonant frequency $f_R$ at which it will oscillate, this frequency depending in a rather complicated manner upon the effective parameters (inductance, capacitance, resistance) of the various elements, including the crystal. A capacitor, connected between one of the electrodes and ground, can be added for the purpose of changing ("tuning") the resonant frequency of the circuit.

In order to vary ("pull") the resonant frequency of a crystal oscillator circuit while it is oscillating, a varactor (variable capacitor) is substituted for the capacitor. During circuit operation, the capacitance of the varactor is varied by varying an external (control) voltage $V_C$ applied to the varactor, whereby the resonant frequency of oscillation of the circuit is pulled ("shifted") by an amount $\Delta f_R$ that depends upon the magnitude of $V_C$. However, in many practical applications, the range (interval) of resonant frequencies ("pull range") at which the circuit can oscillate is limited to a narrower frequency interval ($f_{max} - f_{min}$) than is desired. For example, in some practical applications, it is desired to synchronize the clock circuits of two remotely located pieces of equipment by means of a separate VCXO located at each of them, one or both of the VCXOs having unavoidable resonant frequency fluctuations caused by local ambient temperature fluctuations. In such cases, the resonant frequency pull range of one of the VCXOs may not be wide enough to accommodate the unavoidable frequency fluctuations of the other VCXO.

Therefore, it would be desirable to have VCXO circuitry that will increase the pull range.

SUMMARY OF THE INVENTION

In order to increase the resonant frequency pull range of a VCXO circuit, in accordance with the invention, the circuit is balanced by means of another (substantially identical) varactor. More specifically, the inventive circuit (FIG.1) comprises:

(a) a crystal oscillator element having first and second terminals;
(b) a first varactor having one of its terminals connected directly to the input terminal of the amplifier and another of its terminals connected to a common node;
(c) a second varactor, substantially identical to the first varactor, having one of its terminals connected directly to the output terminal of the amplifier and another of its terminals connected directly to the common node; and
(d) means for applying a control voltage to the common node in order to vary the oscillation frequency of the oscillator element.

In addition, in order to linearize the circuit response—i.e., to make the relationship between the resonant frequency shift $\Delta f_R$ and the applied control voltage $V_C$ more nearly linear—third and fourth varactors are added (FIG. 2) to the circuit and are respectively connected from the input and output terminals of the amplifier to another common node. During operation, the input control voltage $V_C$ is applied through an input network to the two common nodes such that the resulting auxiliary control voltages $V_A$ and $V_B$, respectively, applied to these nodes differ in a nonlinear manner as a function of $V_C$. For example, the input network can be arranged so that the auxiliary control voltages $V_A$ and $V_B$ can advantageously differ by the gate-to-source voltage drop of an MOS transistor. Further, in order to achieve (near) linearity over a wider range of input voltages $V_C$, the aforementioned auxiliary control voltages $V_A$ and $V_B$ are derived from a non-linear voltage divider network (FIG. 3) which compensates for other circuit nonlinearities. The flexibility offered by the two common nodes thus enables simultaneously wider pull range and better linearity.

BRIEF DESCRIPTION OF THE DRAWING(S)

This invention, together with its features, advantages, and characteristics may be better understood from the following detailed description when read in conjunction with the drawing in which.

DETAILED DESCRIPTION

Figure 1:
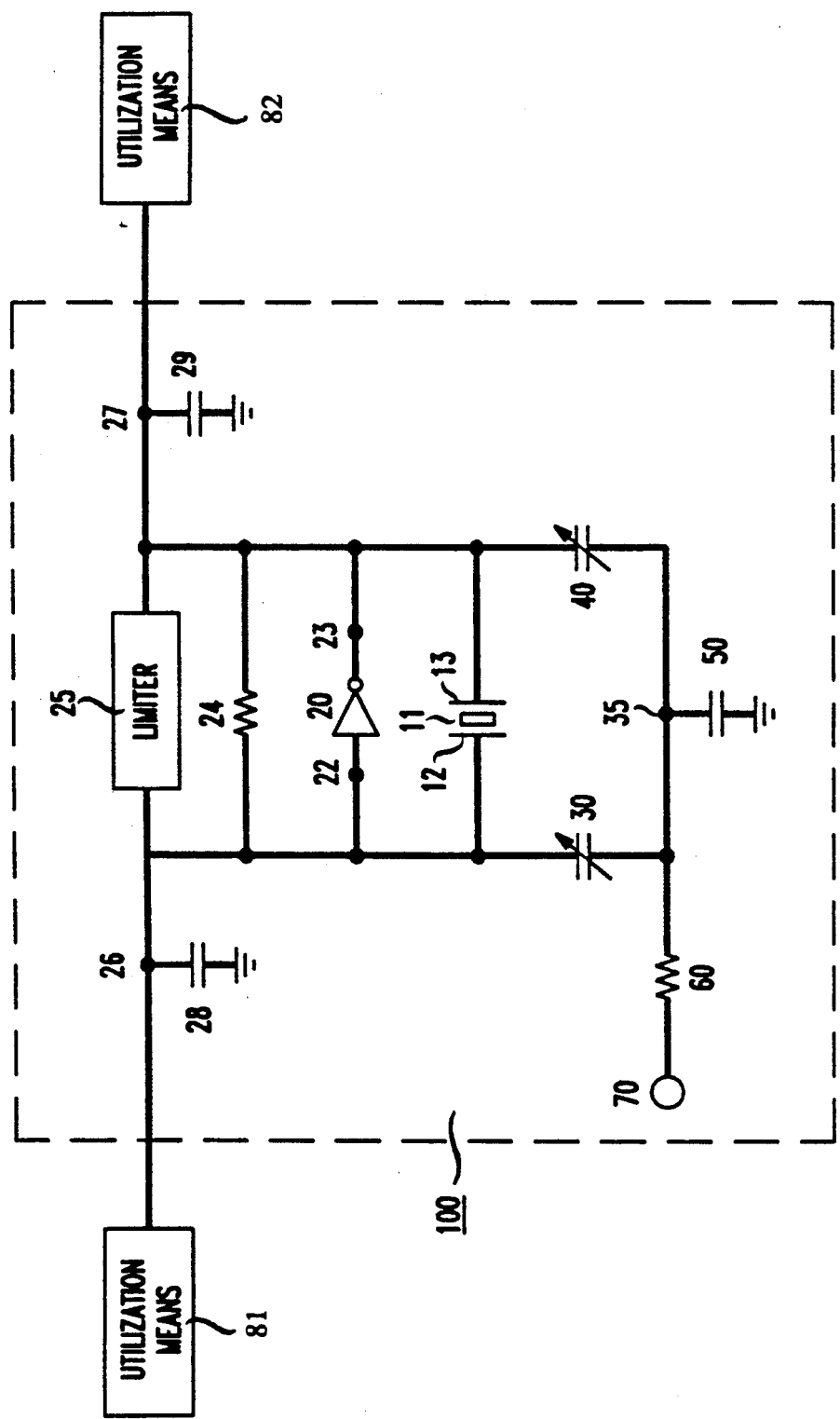
FIG. 1 is a schematic diagram of a VCXO circuit, in accordance with a specific embodiment of the invention.

As shown in FIG. 1, a VCXO circuit 100 has an input control voltage terminal 70 and a pair of output terminals 26 and 27. The circuit 100 further comprises a crystal oscillator element 11, typically a quartz crystal, to which a pair of electrodes 12 and 13 are attached. Still further, an inverting amplifier 20 in the circuit 100 has an input terminal 22 connected to the electrode 12 and an output terminal 23 connected to the electrode 13. For a Pierce oscillator circuit, as is preferred, the amplifier 20 is connected in a common source configuration (in MOS technology); that is, for example, the input terminal 22 is connected to the gate of a driver MOS transistor whose source terminal is connected to a fixed voltage source $V_{SS}$ and whose drain terminal is connected to the output terminal 23 of the amplifier 20, the output terminal of the amplifier being connected through a load to another fixed voltage source $V_{DD}$. The electrode 12 is connected through a first varactor 30 to a common node 35, and the electrode 13 is connected to a second varactor 40 to the same common node 35. These first and second varactors 30 and 40 are preferably substantially identical ("matched pair"), in order to balance the circuit. However, for useful operation, they can differ by as much as about a factor of 2. The common node 35 is connected to ground through a capacitor 50. The common node 35 also connected through a resistor 60 to the input control voltage terminal 70.

During circuit operation, the input control voltage $V_C$ is applied to the control voltage terminal 70 for the purpose of pulling the resonant oscillation frequency $f_R$. The resistor 60, as known in the art, helps to isolate the circuit 100 from noise at the input terminal 70, as well as to minimize power dissipation at the oscillation frequency.

In addition, a resistor 24 is connected across the amplifier 20, as known in the art in order to ensure that the average voltage on the input and output terminals 22 and 23 are the same, whereby distortion in the output, caused by otherwise large deviations from the desired 50 percent in the duty cycle of the output waveform are minimized.

A voltage limiter 25 is connected across the amplifier 20, as known in the art, in order to limit the amplitude of oscillations and hence to render the control voltages $V_C$ more effective in pulling the resonant oscillation frequency $f_R$—i.e., to increase $(df_R/dV_C)$, and hence to increase the pull range.

The purpose of the capacitor 50, as known in the art, is to stabilize the dc voltage at the common node 35. Typically, it has a capacitance equal to at least about ten times that of the (equal) varactors 30 and 40.

The output terminals 26 and 27 of the circuit 100 are to be connected to the input and output terminals 22 and 23, respectively, of the amplifier 20. Utilization means 81 or 82 or both are connected respectively to the output terminals 26 and 27 of the cicuit 100. The oscillations received by the utilization means 81 will have smaller amplitude than those received by the utilization means 82 but will be more nearly purely sinusoidal. Typically, the utilization means are clock circuits to be synchronized by the VCXO circuit 100.

The addition of the varactor 30, in addition to the varactor 40. or of the varactor 40 in addition to the varactor 30, serves to balance the circuit 100. That is, by making equal the variable impedances of the electrodes 12 and 13 to the input control terminal 70, as well as by making equal the variable impedances of the electrodes 12 and 13 to ground, there is achieved a better circuit balancing, which in turn entails less required semiconductor area on which to build the circuit, less power loss, and greater circuit stability. On the other hand, moderate difference between the varactor parameter—say, one varactor being twice as large as the other—can be useful in some instances, as for modifying the relationship between signal amplitude at terminal 26 relative to terminal 27.

Capacitors 28 and 29 optionally can be connected to the output terminal 26 adn 27, respectively, in order to modify permanently the resonant frequency $f_R$ of the circuit 100, as well as to increase the linearity of $\Delta f_R$ vs. $V_C$ (at some expense of pull range, however).

Advantageously, the capacitances of both capacitors 28 and 29, though not necessarily equal, are both less than those of varactors 30 and 40 by at least a factor of about five.

Figure 2:
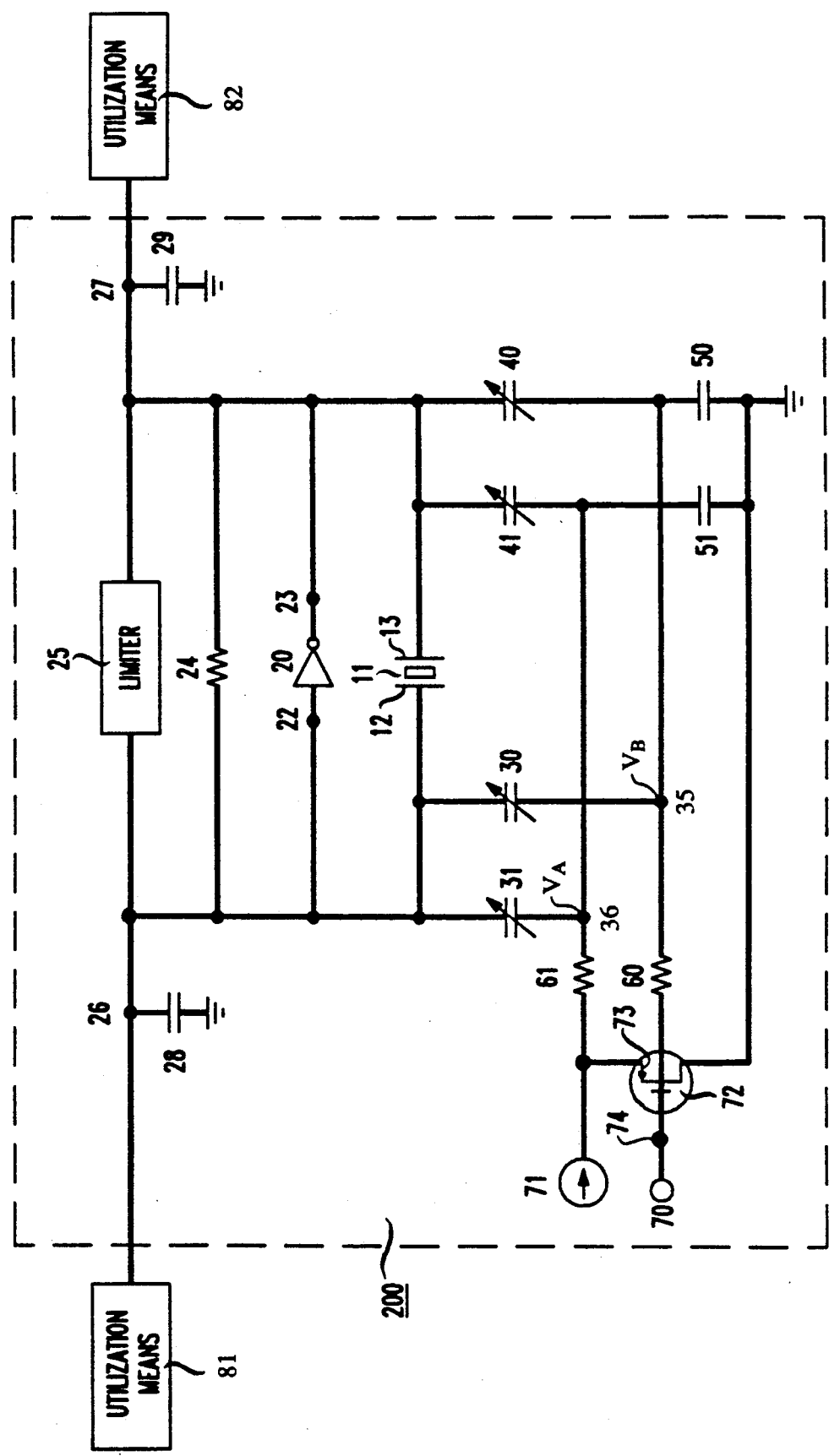
FIG. 2 is a schematic diagram of a VCXO circuit, in accordance with another specific embodiment of the invention.

FIG. 2 shows another embodiment of the invention. Elements shown therein which are similar to, or the same as, those shown in FIG. 1 are denoted by the same reference numerals. As shown in FIG. 2, a VCXO circuit 200 is derived from the above-described VCXO circuit 100 (FIG. 1) by the addition of a parallel path supplied by varactors 31 and 41 connected to a second common node 36, together with a capacitor 51 connected between ground and this second common node 36. Advantageously, all the varactors 30, 31, 40, and 41 are matched. In addition, a resistor 61 is added, for the same purpose as resistor 60, and is connected to the second common node 36. A constant current source 71 is connected to the source terminal 73 of a p channel MOS transistor 72, and the gate terminal 74 of this MOS transistor 72 is connected to the input control voltage terminal 70.

During operation the control voltage $V_C$ is applied at this input control voltage terminal 70, and auxiliary control voltages $V_A$ and $V_B$, respectively, are developed at common nodes 36 and 35. These voltages $V_A$ and $V_B$ differ by the diode gate-to-source voltage drop of the transistor 72. Thus, these voltages $V_A$ and $V_B$ respond in a nonlinear way with respect to the input control voltage $V_C$. By properly selecting the various parameters of the circuit 200, this nonlinearity in $V_A$ and $V_B$ can serve to compensate for the nonlinearities in the above-described circuit 100, whereby a more nearly linear $\Delta f_R$ vs. $V_C$ is obtained in the circuit 200 than in the circuit 100. The added varators paths in the circuit 200 thus give flexibility to achieve more near linearity of $\Delta f_R$ vs. $V_C$ in the circuit 200 than in the circuit 100.

Figure 3:
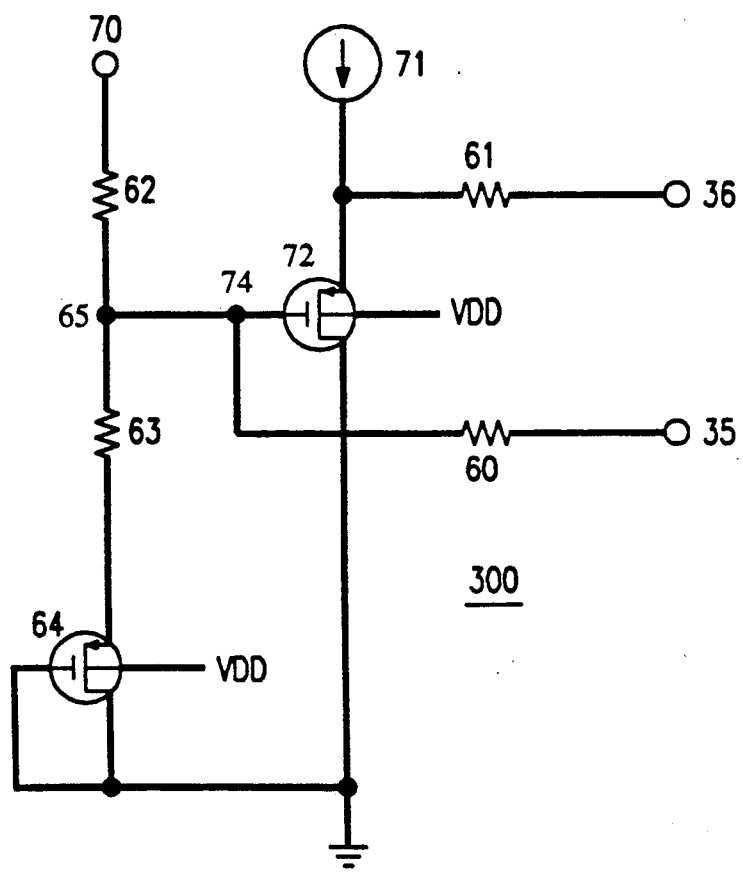
FIG. 3 is a schematic diagram of a nonlinear voltage divider network useful for developing control voltages for the circuit shown in FIG. 2, in accordance with yet another embodiment of the invention.

FIG. 3 shows a nonlinear voltage divider network 300 which can advantageously be used for the purpose of producing the aforementioned voltages $V_A$ and $V_B$ terminals 36 and 35, respectively, instead of the arrangement shown in FIG. 2 for this purpose. Elements shown in FIG. 3 that are similar to, or the same as, those shown in FIG. 2, instead of are denoted by the same reference numerals.

As shown in FIG. 3, a voltage divider is formed by the series connection of resistors 62, 63, and the source-to-drain resistance of an auxiliary p channel MOS transistor 64 whose gate is connected to its drain (load configuration). The gate terminal 74 of the transistor 72 is connected to a node 65 between the resistors 62 and 63. As a consequence of the nonlinear characteristics of the source-drain resistance of the MOS transistor 64, the voltage developed at the gate terminal 74 is a nonlinear function of $V_C$, rather than being equal to $V_C$ as in the circuit 200 (FIG. 2). Moreover, this nonlinearity can further compensate for the nonlinearities in the circuit 200.

Although the invention has been described in detail with respect to specific embodiments, various modifications can be made without departing from the scope of the invention. For example, additional varactors connected to additional control voltages can be added, in order to provide even more nearly linear oscillation frequency response.

I claim:

1. A voltage controlled oscillator circuit comprising:
   (a) a crystal oscillator element having first and second terminals;
   (b) an amplifier having an input terminal connected to the first terminal of the crystal oscillator element and an output terminal connected to the second terminal for the crystal oscillator element;
   (c) a first varactor having one of its terminals connected directly to the input terminal of the amplifier and another of its terminals connected to a common node;
   (d) a second varactor having one of its terminals connected directly to the output terminal of the amplifier and another of its terminals connected directly to the common node;
   (e) means for applying a control voltage to the common node in order to pull the oscillation frequency of the oscillator element;
   (f) a third varactor having one of its terminals connected to the input terminal of the amplifier and another of its terminals connected to another common node;

(g) a fourth varactor having one of its terminals connected to the output terminal of the amplifier and another of its terminals connected to said another common node; and (h) means for applying a bias voltage, different from the control voltage, to said another common node.

2. The circuit of claim 1 and a utilization means connected to the output terminal of the amplifier.

3. The circuit of claim 1 and a utilization means connected to the input terminal of the amplifier.

4. The circuit of claim 3 and a utilization means connected to the output terminal of the amplifier.

5. The circuit of claim 1 in which the means for applying a bias voltage include:

a first MOS transistor;

a current source, connected to a high current-carrying-terminal of the first MOS transistor, for driving a constant current through the source-drain path of the first MOS transistor;

resistive means to connect the common node to the gate terminal of the first MOS transistor;

resistive means to connect said another node to the high-current-carrying terminal of the first MOS transistor.

6. The circuit of claim 5 and utilization means connected to the input terminal of the amplifier.

7. The circuit of claim 5 and utilization means connected to the output terminal of the amplifier.

8. The circuit of claim 7 and utilization means connected to the input terminal of the amplifier.

9. The circuit of claim 5 further comprising first and second resistors and a second MOS transistor mutually connected in series, the node between the first and second resistors being connected to the gate terminal of the first MOS transistor.

10. The circuit of claim 9 and a utilization means connected to the input terminal of the amplifier.

11. The circuit of claim 9 and a utilization means connected to the output terminal of the amplifier.

12. The circuit of claim 11 and a utilization means connected to the input terminal of the amplifier.

13. The voltage controlled oscillator circuit of claim 1 in which the capacitances of the first, second, third, and fourth varactors are mutually equal for any applied operating voltage.

* * * * *